(12) United States Patent
Backsen et al.

(10) Patent No.: US 9,342,641 B1
(45) Date of Patent: May 17, 2016

(54) CONFIGURATION OF LOGIC ANALYZER USING GRAPHICAL USER INTERFACE

(71) Applicant: Keysight Technologies, Inc., Minneapolis, MN (US)

(72) Inventors: Michael Shaun Backsen, Westcliffe, CO (US); Jennie Colleen Grosslight, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/266,527

(22) Filed: Apr. 30, 2014

(51) Int. Cl.
*G06F 17/00* (2006.01)
*G06F 17/50* (2006.01)

(52) U.S. Cl.
CPC .................... *G06F 17/505* (2013.01)

(58) Field of Classification Search
CPC .................... G06F 17/30; G06F 17/50
USPC .................................................. 716/100
See application file for complete search history.

(56) References Cited

U.S. PATENT DOCUMENTS

| | | | |
|---|---|---|---|
| 5,282,213 A | | 1/1994 | Leigh et al. |
| 6,460,148 B2 | | 10/2002 | Veenstra et al. |
| 7,328,375 B2 | | 2/2008 | Gupta et al. |
| 7,340,693 B2 | | 3/2008 | Martin et al. |
| 8,661,166 B2 | | 2/2014 | Chew |
| 2004/0225924 A1 | * | 11/2004 | Beck et al. .................. 714/39 |
| 2011/0167311 A1 | | 7/2011 | Bailey et al. |
| 2012/0068229 A1 | | 3/2012 | Bemanian et al. |
| 2012/0278781 A1 | * | 11/2012 | Wann et al. .................. 716/122 |
| 2012/0300555 A1 | * | 11/2012 | Shin et al. ............... 365/189.03 |
| 2014/0013163 A1 | | 1/2014 | Chene |

* cited by examiner

*Primary Examiner* — Mohammed Alam

(57) ABSTRACT

A method of configuring a logic analyzer based on user input received through a graphical user interface (GUI) comprises receiving at least one first GUI input identifying at least one characteristic of a target system configured to be connected to the logic analyzer, receiving at least one second GUI input indicating a footprint associated with the target system, and receiving at least one third GUI input indicating a mapping between the footprint and a connector of the logic analyzer.

18 Claims, 7 Drawing Sheets

CONFIGURATION OF LOGIC ANALYZER USING GRAPHICAL USER INTERFACE

BACKGROUND

A logic analyzer is an electronic instrument used to analyze signals from a digital system or circuit. Such analysis may comprise, for instance, evaluation of timing, logic, or protocol adherence, among other things.

During typical operation, a logic analyzer is physically connected to a digital system or circuit to be analyzed (hereafter, the "target system"). This connection generally comprises mating between one or more pod connectors associated with the logic analyzer, and one or more footprints associated with the target system.

As used herein, the term "pod connector" denotes a physical grouping of connection interfaces (e.g., pins, pin receptacles, signal pads, etc.) associated with a logic analyzer, and the term "footprint" denotes a physical grouping of connection interfaces associated with a target system. The physical grouping of connection interfaces may include, for example, embedding them in a pluggable unit, such as a multi-pin connector head, or organizing a set of signal pads on a target board. A pod connector is typically mounted on one end of a logic analyzer cable, and a footprint is typically mounted on a board associated with the target system.

To properly analyze the signals from the target system, the logic analyzer must recognize correspondences between the connection interfaces of each pod connector and the signals provided through the corresponding footprint. In other words, it must recognize which signal of the target system is to be received through each connection interface of each pod connector.

In some scenarios, the logic analyzer can identify these correspondences through an automated or semi-automated setup process. For example, before analyzing signals on a double data rate (DDR) or low power DDR (LPDDR) memory bus, a logic analyzer may run a wizard-type setup program to guide a user in selecting an appropriate setup file for the memory bus. The setup file may define many (sometimes well over a hundred) signals on the DDR or LPDDR memory bus and map them to corresponding connection interfaces of a pod connector, which in turn correspond to logic analyzer channels. It may also conform to naming conventions that enable a signal decoder and compliance tools to work correctly, set up data viewers for ease of use, and initialize many other aspects of a logic analyzer graphical user interface (GUI) so that the user does not need to manage these setup details.

A typical logic analyzer provides setup files only for standard probing solutions. Accordingly, if a user has defined a non-standard set of pinouts to a logic analyzer, then no existing setup file will work without modifications. Making these modifications, however, can be cumbersome and error-prone, requiring the user to either go through hundreds of steps in a logic analyzer GUI or to modify a fairly cryptic XML file describing logic analyzer setup.

In view of these and other shortcomings of conventional approaches to logic analyzer configuration, there is a general need for improved approaches that can be used with target systems having non-standard connection interfaces.

SUMMARY

According to a representative embodiment, a method of configuring a logic analyzer based on user input received through a GUI comprise receiving at least one first GUI input identifying at least one characteristic of a target system configured to be connected to the logic analyzer, receiving at least one second GUI input indicating a footprint associated with the target system, and receiving at least one third GUI input indicating a mapping between the footprint and a connector of the logic analyzer.

According to another representative embodiment, a system comprises a first component configured to identify at least one characteristic of a target system to be connected to a logic analyzer based on at least one first GUI input, a second component configured to determine a footprint of the target system based on at least one second GUI input, and a third component configured to determine a mapping between the footprint and a connector of the logic analyzer based on at least one third GUI input.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
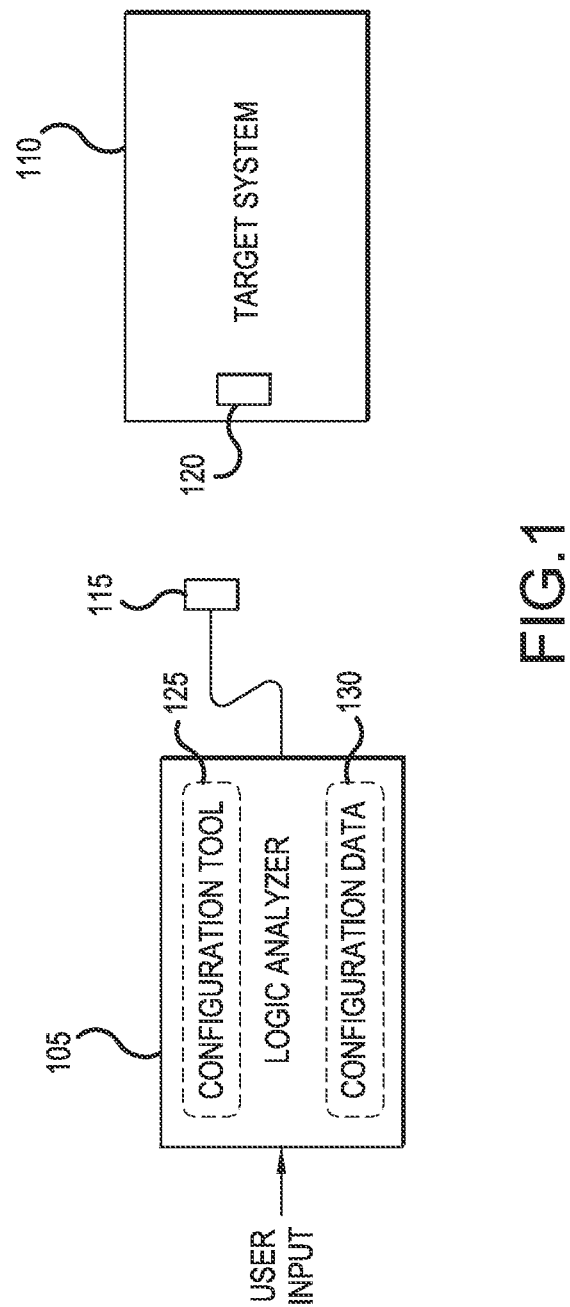
FIG. 1 is a block diagram illustrating a logic analyzer and a target system to be connected to the logic analyzer according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to techniques and technologies for configuring a logic analyzer using a GUI, which can be modeled on an end user's target system schematic. In certain embodiments, the GUI allows a user to enter information indicating a type of target system to be connected to the logic analyzer, and a type of at least one footprint of the target system to be connected to a corresponding pod connector of the logic analyzer. Based on the provided information, the GUI then displays graphical information representing connection interfaces of the logic analyzer and/or target system, and it allows the user to provide inputs indicating a mapping between signals output by the target system and the connection interfaces of the logic analyzer. The provided inputs can then be used to generate a setup file or perform some other configuration function for the logic analyzer.

These and other embodiments may provide several benefits compared to conventional logic analyzer setup. First, they may allow a user to successfully acquire data and use logic analyzer decoders and compliance tools without requiring detailed knowledge of a specific logic analyzer setup. For example, in some contexts the only thing the user needs to do is specify a custom pinout, and this task can be facilitated by presenting the user with a GUI that matches their schematic drawings, allowing them to basically copy selected details of the schematic. Second, the process of mapping signals can typically be done quickly, and may be less error prone than conventional approaches. Some ways to reduce errors, for instance, are to visually highlight signals that are already mapped, and to perform parts of the mapping or setup process automatically.

FIG. 1 is a block diagram illustrating a logic analyzer 105 and a target system 110 to be connected to logic analyzer 105 according to a representative embodiment.

Referring to FIG. 1, logic analyzer 105 comprises a pod connector 115 that can be connected to a footprint 120 on target system 110, a configuration tool 125 that allows a user to perform certain setup operations as described below, and configuration data 130 that defines a setup of logic analyzer 105. Configuration tool 125 typically comprises a GUI and related software for presenting information and receiving user inputs to generate configuration data 130.

Although configuration tool 125 is shown as part of logic analyzer 105, it could alternatively be implemented in a separate system, such as a personal computer. In other words, configuration tool 125 can be considered a stand-alone software tool or it may be integrated with another system such as a logic analyzer. Additionally, configuration tool 125 does not necessarily require that other logic analyzer software to be installed in order to run it. For example, it could be implemented with schematic-centric language and graphics and only require that a user specify a type of target system (e.g., LPDDR2, DDR4, etc.) or that the user provide basic information on busses and signals to measure on the target system, before proceeding directly to a process of mapping signals.

During typical operation, logic analyzer 105 is connected to target system 110, and these two components communicate with each other to analyze the functioning of target system 110. This generally involves transmission of signals from target system 110 to logic analyzer 105, and display of those signals on a screen of logic analyzer 105. It also typically involves transmission of control and/or test signals from logic analyzer 105 to target system 110.

To facilitate proper analysis, logic analyzer 105 may be required to recognize each signal received from target system 110 through pod connector 115. For example, it may be required to recognize the names of signals so that it can display those names next to accompanying waveforms, or it may be required to recognize the types of signals in order to perform relevant processing functions such as protocol decoding. The above requirement can generally be satisfied by mapping each connection interface of pod connector 115 to a signal of target system 110 or to a connection interface of footprint 120, and then storing the mapping as part of configuration data 130. Such a mapping may comprise, for instance, an indication that "pin 1" of pod connector 115 receives a clock signal CLK, "pin 2" receives a data signal DQ, and so on. The mapping can be performed automatically if target system 110 conforms to a standardized or otherwise well-known connection scheme. However, if target system 110 has a custom pinout or custom signal routing, as is common in many modern systems, the mapping process may be cumbersome and not readily automated. Nevertheless, configuration tool 125 may simplify the process by allowing the user to establish the mapping through a data entry process involving a GUI. An example of such a process is illustrated by FIGS. 2 through 6.

FIGS. 2 through 6 show various screenshots of a GUI used to configure a logic analyzer according to representative embodiments. For convenience, it will be assumed that the illustrated GUI comprises part of configuration tool 125 and is used to configure logic analyzer 105 with respect to target system 110, and it will be further assumed that target system 110 is an LPDDR or DDR memory bus. In general, however, the described concepts are not limited to a particular host platform or target system.

Figure 2:
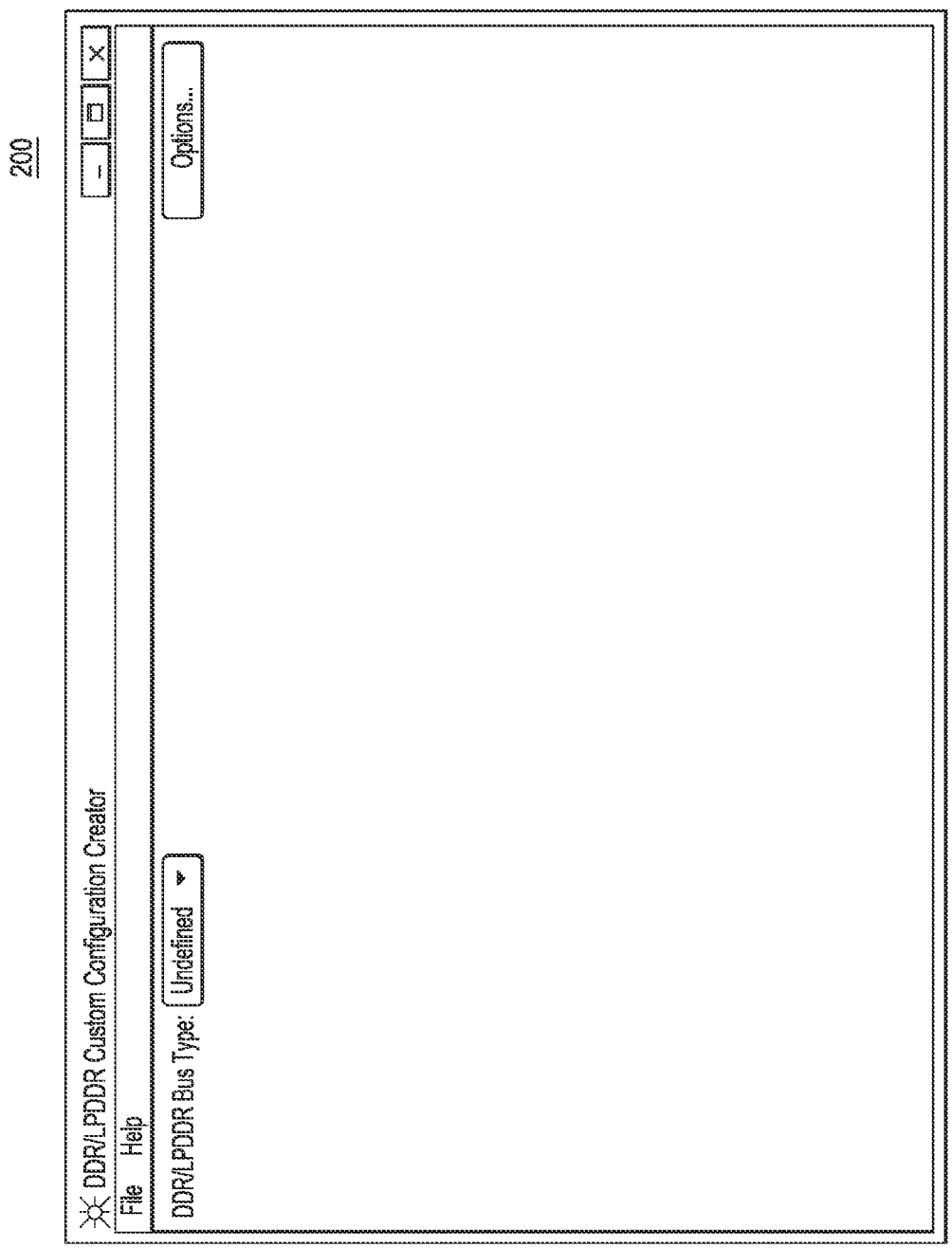
FIG. 2 shows a GUI configured to receive user input to configure a logic analyzer according to a representative embodiment.

Referring to FIG. 2, a first screen 200 allows a user to enter information indicating a type of target system 110. Once the user enters this information, the GUI may automatically transition to a second screen 300 shown in FIG. 3.

In the example of FIG. 2, the information is entered through a drop down menu that is initially labeled "Undefined". Alternatively, the information could be entered in a different form, e.g., through a text box, radio button, dialog box, text file, etc. Although not shown, the drop down menu may present various pre-defined options corresponding to different bus types, such as LPDDR, LPDDR2, DDR, DDR2, etc. These pre-defined options may, in turn, correspond to pre-defined signaling specifications, such as those associated with various types of LPDDR or DDR. For convenience, the signaling specifications may be stored in logic analyzer 105 or some other platform hosting configuration tool 125. Accordingly, when a user selects a particular type of target system, configuration tool 125 may access data for a corresponding signaling specification and then use the accessed information for subsequent configuration tasks.

Figure 3:
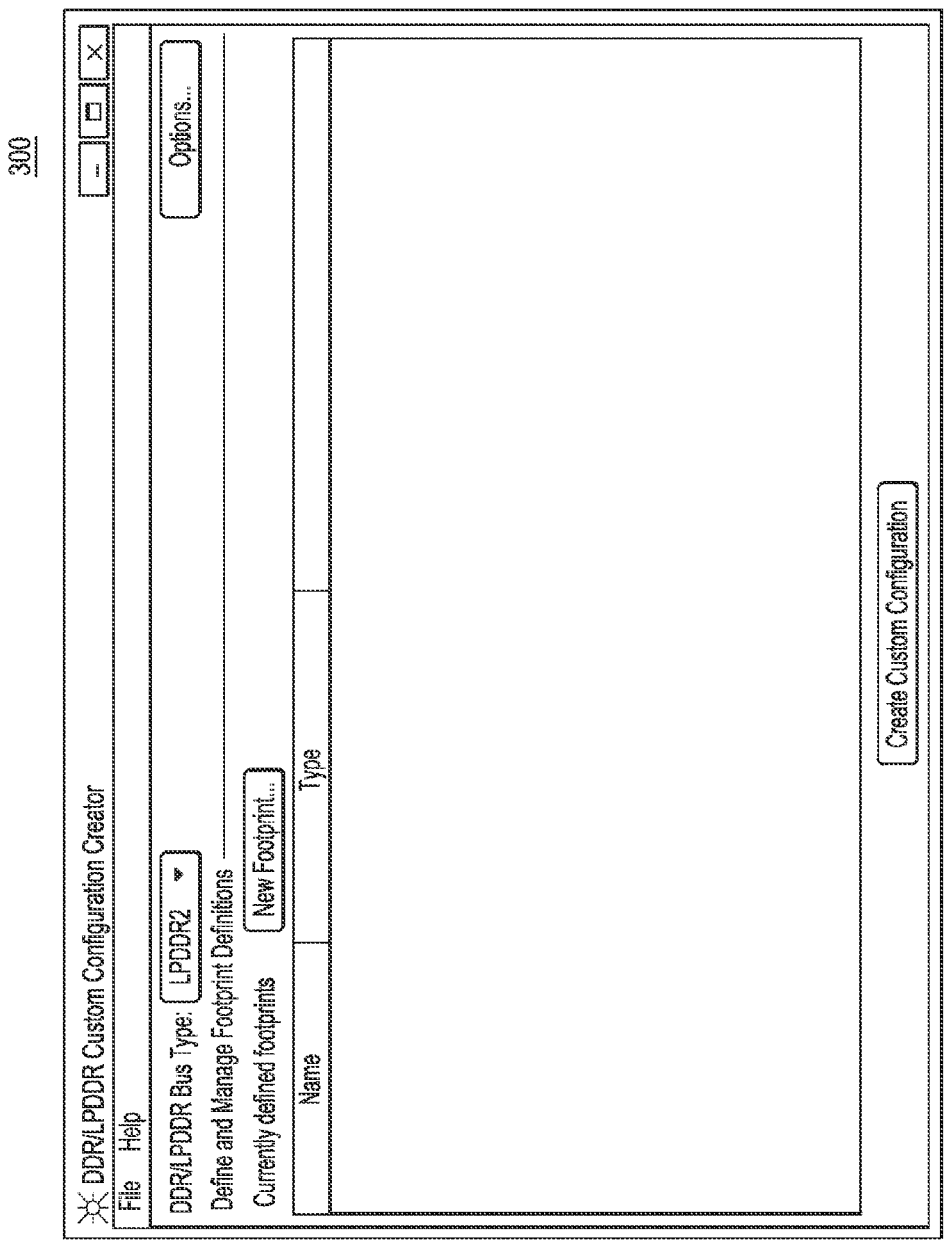
FIG. 3 shows another GUI configured to receive user input to configure a logic analyzer according to a representative embodiment.

Referring to FIG. 3, second screen 300 allows a user to define and manage one or more footprints (e.g., footprint 120) to be connected to logic analyzer 105. A user can add a new footprint to the configuration of logic analyzer 105 by selecting a button labeled "New Footprint . . . " and then entering information for the new footprint, such as its name and a type of the connector. Although not shown in the drawings, entry of this information may be performed via a screen or entry field presented to a user between second screen 300 and a third screen 400. Selection of the "New Footprint . . . " button in FIG. 3 initiates the display of third screen 400, which is used for mapping signals associated with the new footprint onto connection interfaces of pod connector 115.

Figure 4:
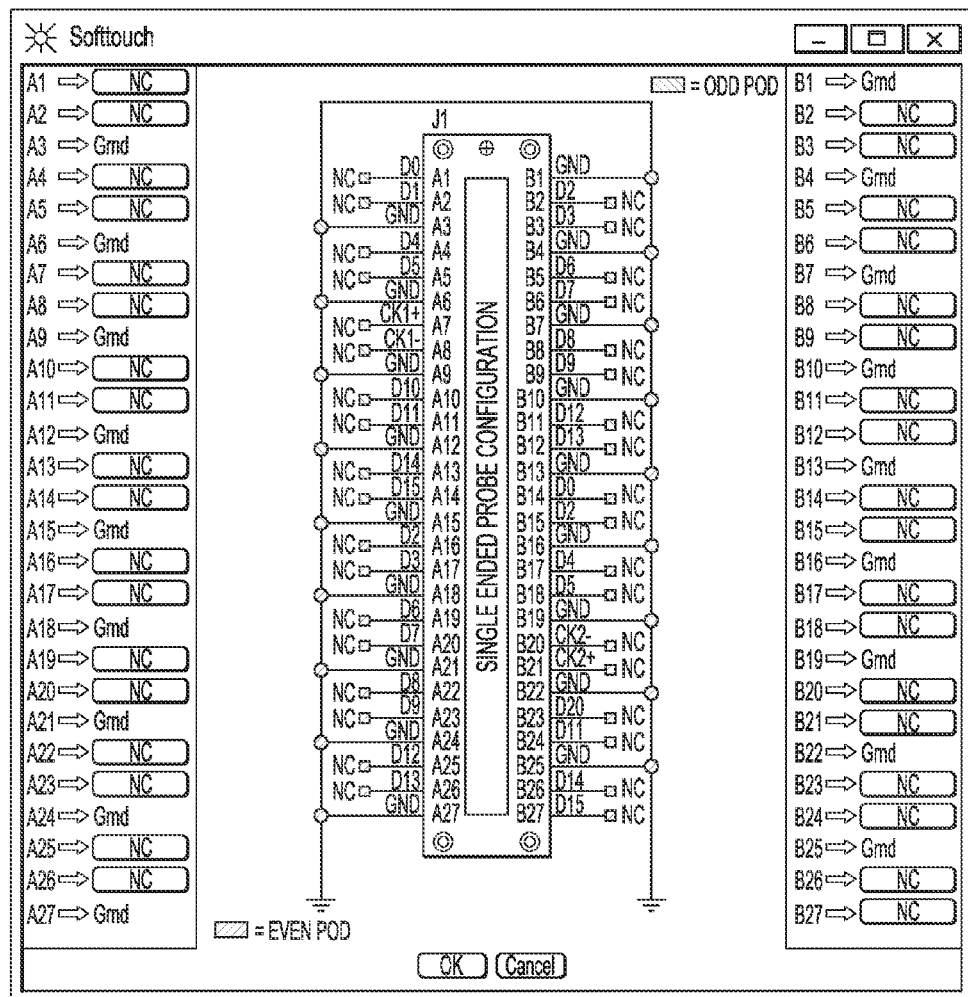
FIG. 4 shows yet another GUI configured to receive user input to configure a logic analyzer according to a representative embodiment.

Referring to FIG. 4, third screen 400 comprises a schematic of a footprint (e.g., footprint 120) to be connected to a pod connector of the logic analyzer. The nature of the displayed schematic is determined by the selected type of footprint, which in the illustrated example is a fairly standard "Softouch" connector. Other possible selections could be, for example, a general "Custom" type, which could result in the display of an interface for a standard logic analyzer pod connector, or a user defined type associated with a unique schematic.

The schematic shows connection interfaces of the footprint, labeled A1 through A27 and B1 through B27. It also shows connection interfaces of two pod different connectors, each labeled D0 through D15. The connection interfaces of the two pod connectors are labeled as an "Odd Pod" and an "Even Pod". The use of multiple pod connectors, as well as the designations "Odd" and "Even" are mere examples, and may or may not be present in other embodiments.

Third screen 400 further comprises graphical buttons for selecting signals to be associated with the respective connection interfaces of the footprint. Initially, these buttons are labeled "NC", meaning Not Connected. Subsequently, the user can select a signal to be associated with each connection interface, and the button labels will be changed to reflect the selection, as illustrated by a fourth screen 500 in FIG. 5.

Figure 5:
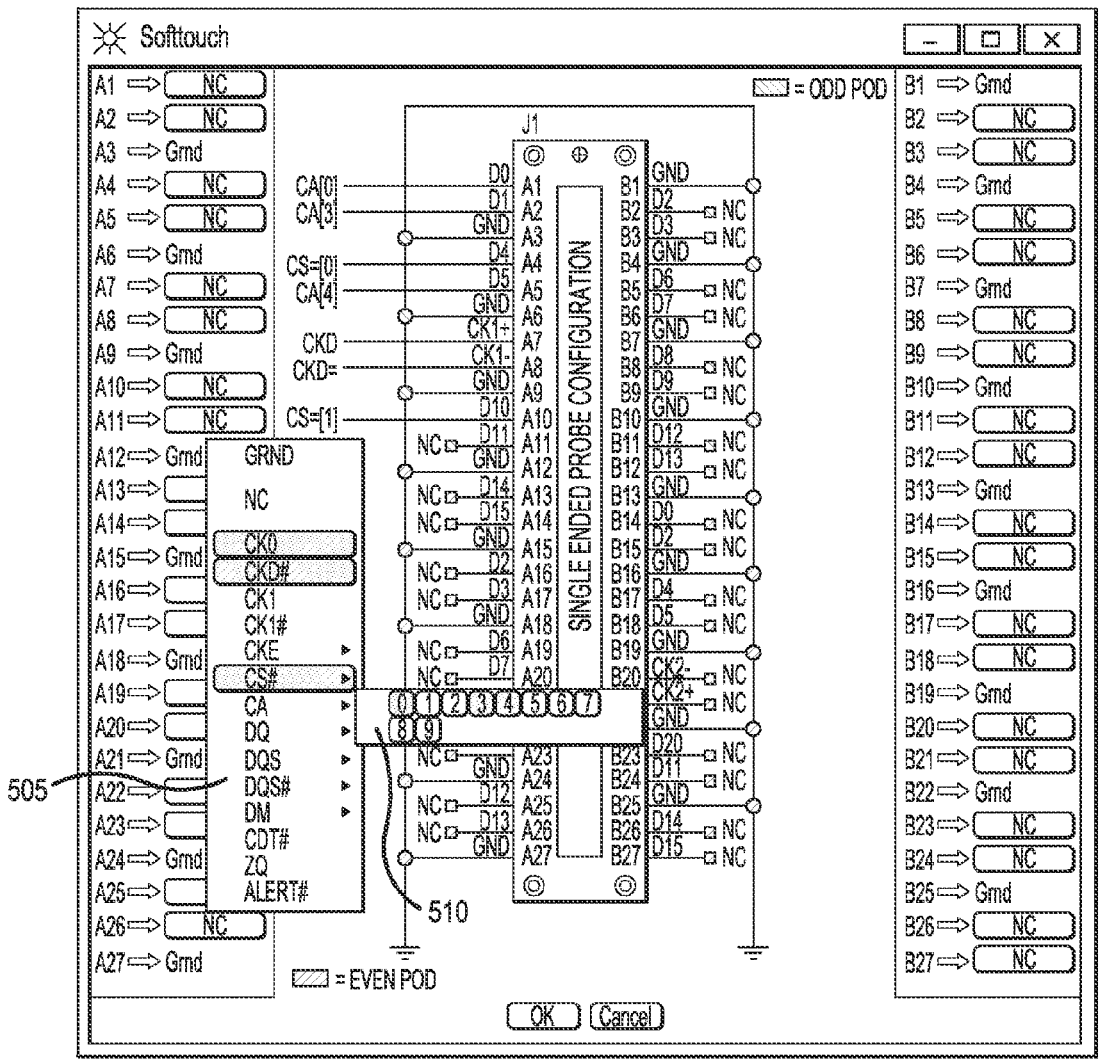
FIG. 5 shows yet another GUI configured to receive user input to configure a logic analyzer according to a representative embodiment.

Referring to FIG. 5, when a user clicks on one of the graphical buttons A1 through A27 in fourth screen 500, a menu 505 appears to allow user selection of a signal. The menu may be populated with signals known to be associated with the target system. For example, if the target system is a DDR bus, the signals may be those associated with a relevant DDR standard. Such information can be stored in a platform containing configuration tool 125, and then accessed according to the selected target system type.

In the illustrated example, menu 505 includes menu items indicating signals CK0, CK0#, CK1, and so on, as shown in the drawing. Some of the menu items have sub-menus, such as the illustrated menu 510. Menu 510 is a sub-menu for the signal "CA", and it is used to select signals CA0 through CA9. Other sub-menus can be used in a similar manner.

Signals that have already been mapped to one of the connection interfaces of the footprint are highlighted (e.g., with shading or alternatively color coding) in menus 505 and 510. For example, signals CK0 and CK0# have been mapped to connection interfaces A7 and A8, respectively, and are therefore highlighted in menu 505. Similarly, signal CA[4] has been mapped to connection interface A5 and is therefore highlighted in menu 510. The highlighting of the already mapped signals can prevent a user from accidentally mapping the same signal to multiple connection interfaces.

Once the user has mapped signals to corresponding connection interfaces using fourth screen 500, the user may select the "OK" button to save the mapping. Following selection of the OK button, a fifth screen 600 is displayed, as illustrated in FIG. 6.

Figure 6:
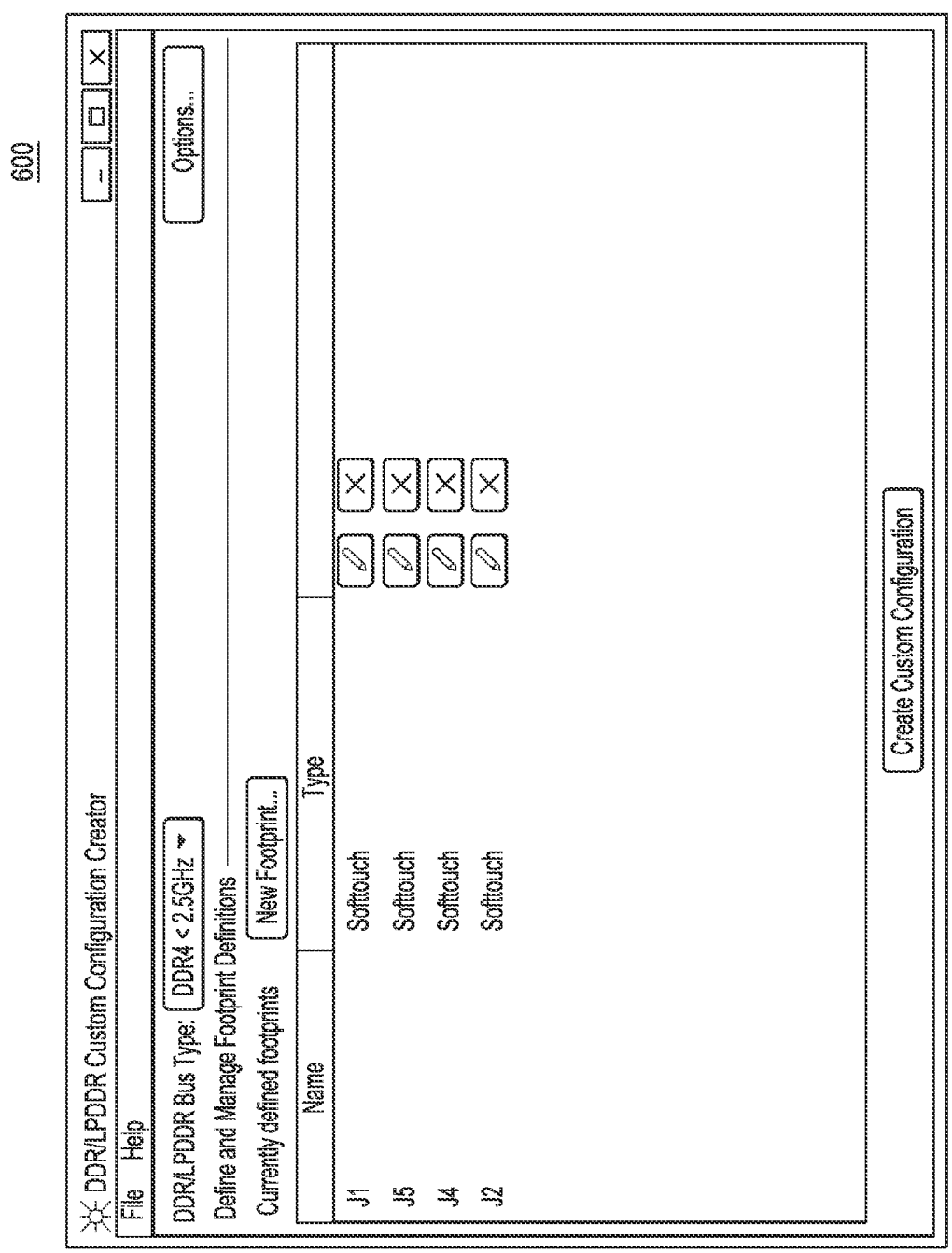
FIG. 6 shows yet another GUI configured to receive user input to configure a logic analyzer according to a representative embodiment.

Referring to FIG. 6, fifth screen 600 is version of second screen 300 that has been updated to reflect the selection of a particular bus type (DDR4, 2.5 GHz) and the addition of several footprints. The footprint of FIGS. 4 and 5 has the name "J1", as illustrated at the top or those figures. A list of this and other defined footprints is shown in fifth screen 600. These defined footprints may allow multiple connector pods to be connected to a target system during a system analysis.

Once all footprints have been defined and mapped, the user selects a "Create Custom Configuration" button, and configuration tool 125 creates configuration data 130, e.g., a logic analyzer setup file. The logic analyzer setup file can be used in combination with one or more automated processes, such as a DDR Setup Assistant, to accomplish a full logic analyzer setup for the target system.

Figure 7:
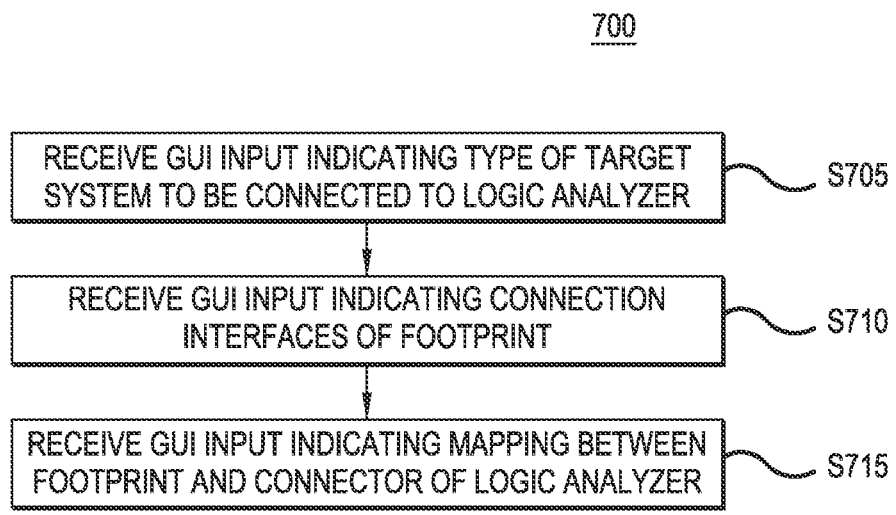
FIG. 7 is a flowchart illustrating a method of configuring a logic analyzer according to a representative embodiment.

FIG. 7 is a flowchart illustrating a method 700 of configuring a logic analyzer according to a representative embodiment. For convenience, the method of FIG. 7 will be described with reference to logic analyzer 105 and target system 110 of FIG. 1, although the method is not limited to this or any other implementation.

Referring to FIG. 7, the method comprises receiving a GUI input indicating at least one characteristic of target system (e.g., a type of the system) to be connected to a logic analyzer (S705). As used herein, the term "GUI input" refers to any type of user input received through a GUI, for instance, by clicking a button, making a menu selection, or typing in text. The type of target system may be, for example, a type of DDR or LPDDR bus, and the selection of the type may be performed as described with reference to FIG. 2, for example.

The method further comprises receiving a GUI input indicating connection interfaces of a footprint of a target system (S710). This indication can be made, for instance, by specifying a type of the footprint as in FIG. 3, or by some other mechanism. As described with reference to FIG. 3, the type of the footprint may be, for example, a "Soft touch" connector, a "Custom" connector, or some other type of connector.

The method still further comprises receiving a GUI input(s) indicating a mapping between the footprint and a connector of the logic analyzer (S715). The mapping may indicate, for example, correspondences between signals of the target system and connection interfaces of the logic analyzer connector. Alternatively, it may indicate correspondences between connection interfaces of the target system and those of the logic analyzer connector. As part of operation S715, the method may further comprise displaying a schematic corresponding to the selected footprint type, and receiving the GUI input(s) in conjunction with the display, as illustrated by FIGS. 4 and 5, for example. Following operation S715, the method may still further comprise generating a setup file or otherwise configuring a logic analyzer based on the mapping.

As indicated by the foregoing, the described embodiments may facilitate the configuration of logic analyzer pod connector mappings through the use of a GUI that is modeled on a schematic view of the end user's target system. These and other embodiments may provide various benefits, such as improving the efficiency and accuracy of logic analyzer setup, among other things.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of configuring a logic analyzer based on user input received through a graphical user interface (GUI), comprising:
   receiving at least one first GUI input identifying at least one characteristic of a target system configured to be connected to the logic analyzer;
   receiving at least one second GUI input indicating a footprint associated with the target system; and
   receiving at least one third GUI input indicating a mapping between the footprint and a connector of the logic analyzer, wherein the first GUI input indicates a type of the target system, and the indicated type is a type of double data rate (DDR) or low power DDR (LPDDR) memory bus.

2. The method of claim 1, further comprising generating a setup file for the logic analyzer according to the mapping.

3. The method of claim 2, further comprising configuring the logic analyzer according to the setup file.

4. The method of claim 1, further comprising displaying a schematic of the footprint, and receiving the at least one third GUI input through a display including the schematic.

5. The method of claim 4, further comprising accessing stored information indicating signals associated with the schematic, and displaying the signals in the display.

6. The method of claim 1, wherein receiving at least one first GUI input comprises receiving a selection of a menu item.

7. The method of claim 1, wherein the at least one second GUI input indicating a footprint associated with the target system comprises multiple GUI inputs indicating signals of the footprint.

8. The method of claim 7, wherein the mapping comprises assigning the signals of the footprint to connection interfaces of the connector of the logic analyzer.

9. The method of claim 8, further comprising highlighting portions of the GUI to indicate the assignment of signals.

10. The method of claim 1, wherein the footprint is a soft touch connector.

11. A system, comprising:
a first component configured to identify at least one characteristic of a target system to be connected to a logic analyzer based on at least one first graphical user interface (GUI) input;
a second component configured to determine a footprint of the target system based on at least one second GUI input; and
a third component configured to determine a mapping between the footprint and a connector of the logic analyzer based on at least one third GUI input, wherein the at least one characteristic of the target system comprises a type of the target system, and the type comprises a double data rate (DDR) bus or a low power DDR (LP-DDR) bus.

12. The system of claim 11, further comprising a GUI configured to receive the first through third GUI inputs.

13. The system of claim 12, wherein the GUI is further configured to display a schematic of the footprint, and to receive the at least one third GUI input through a display including the schematic.

14. The system of claim 11, wherein the footprint comprises a soft touch connector.

15. The system of claim 11, further comprising a fourth component configured to generate a setup file for the logic analyzer according to the mapping.

16. The system of claim 11, wherein the first through third components are software components.

17. The system of claim 11, wherein the at least one second GUI input comprises multiple GUI inputs indicating signals of the footprint.

18. The system of claim 17, wherein the mapping comprises assignment of the signals of the footprint to connection interfaces of the connector of the logic analyzer.

* * * * *